United States Patent [19]

Rose

[11] Patent Number: 4,794,676

[45] Date of Patent: Jan. 3, 1989

[54] CLAMPING DEVICE, ESPECIALLY FOR PRINTED CIRCUIT BOARDS

[75] Inventor: Hans Rose, Ottobrunn, Fed. Rep. of Germany

[73] Assignee: Messerschmitt-Boelkow-Blohm Gesellschaft mit beschraenkter Haftung, Munich, Fed. Rep. of Germany

[21] Appl. No.: 136,654

[22] Filed: Dec. 22, 1987

[30] Foreign Application Priority Data

Dec. 23, 1986 [DE] Fed. Rep. of Germany ....... 3644173

[51] Int. Cl.[4] ............................................ A44B 19/18
[52] U.S. Cl. ......................................... 24/495; 24/493
[58] Field of Search ................. 24/495, 493, 494, 496, 24/497, 453, 458

[56] References Cited

U.S. PATENT DOCUMENTS

| 829,789 | 8/1906 | Jones | 24/453 |
|---|---|---|---|
| 1,112,964 | 10/1914 | Anderson | 24/495 |
| 4,504,168 | 3/1985 | Miller | 24/453 |
| 4,649,614 | 3/1987 | Lund | 24/493 |

FOREIGN PATENT DOCUMENTS

| 0166621 | 8/1950 | Austria | 24/495 |
|---|---|---|---|
| 1107028 | 5/1961 | Fed. Rep. of Germany | 24/495 |
| 2659365 | 7/1978 | Fed. Rep. of Germany | 24/495 |
| 2920468 | 11/1980 | Fed. Rep. of Germany | . |
| 2103020 | 2/1983 | United Kingdom | . |

Primary Examiner—Victor N. Sakran
Attorney, Agent, or Firm—W. G. Fasse; D. H. Kane, Jr.

[57] ABSTRACT

Printed circuit boards may be held in place in a releasable manner in the clamping gap of a clamping device having a mounting member and clamping member arranged in parallel to each other to form the clamping gap. The clamping member is pivoted or journalled to the mounting member and an adjustable biasing spring tends to close the clamping gap. The device is simple, universally usable, and has a wide clamping range as well as a high clamping force and good heat removing abilities. An axial movement of an adjustment member permits opening or closing the clamping device.

7 Claims, 2 Drawing Sheets

CLAMPING DEVICE, ESPECIALLY FOR PRINTED CIRCUIT BOARDS

FIELD OF THE INVENTION

The invention relates to a clamping device which has universal applicability for holding flat components in place. The clamping device is especially adapted for holding printed circuit boards in a frame, chassis or housing of an electrical or electronic apparatus.

DESCRIPTION OF THE PRIOR ART

Spring biased clamping devices are well known in the art for various purposes. For example, so-called clip boards have a spring biased clip for holding writing paper in place on the board. Another type of conventional clamp is known in the form of so-called clothespins. These conventional clamps are generally operated by a lever action requiring a certain amount of space for the location and operation and movement of the respective lever. Such space is generally not available when printed circuits must be held in place in a frame or chassis of an electronic apparatus. Frequently, the accessibility of the clamping device also prevents the use of a lever action operating member for the clamp. These devices generally use a torque spring.

OBJECTS OF THE INVENTION

In view of the foregoing it is the aim of the invention to achieve the following objects singly or in combination:

to provide a clamping device which can be held in place in a minimum of space for holding, for example, printed circuit boards exchangeably in place;

to construct a clamping device in such a way that it can be opened by an axial movement against a biasing element while an axial movement in the opposite direction permits the biasing element to close the clamping device; and to provide a clamping device which is adaptable in its clamping range, which has a substantial clamping force, which provides a good heat removing ability, especially in connection with electronic devices, and which is capable of holding printed circuit boards of different thicknesses.

SUMMARY OF THE INVENTION

According to the invention there is provided a clamping device especially for holding printed circuit boards in electrical and electronic devices. The clamping device is characterized in that a mounting member has an upper and lower section that is bent over to form two bracing sections. A clamping member cooperates with the mounting member. For this purpose a link is tiltably pivoted or journalled to the mounting member and to the clamping member. A compression spring biases one end of the clamping member against one of the bracing sections while an axially movable adjustment member such as a set screw in the other bracing section permits the opening and closing of the clamp. The axial movement of the adjustment member also permits opening the clamping gap between the clamping member and the mounting member within a range only limited by the pivoting connecting link.

The present clamping device is quite variable within a substantial range of its clamping force and with regard to the thickness of the printed circuit board to be held in place. Thus, printing circuit boards of substantially all practically useful thicknesses can be mounted in place with a clamp according to the invention. Further, since the clamping member and the mounting member may be made of the same materials different heat expansion coefficients are eliminated so that a clamping gap of constant width throughout its length is assured. Additionally, the present clamping device may be made of materials providing for an efficient heat removal, such as aluminum or the like.

BRIEF DESCRIPTION OF THE DRAWINGS

In order that the invention may be clearly understood, it will now be described, by way of example, with reference to the accompanying drawings, wherein.

DETAILED DESCRIPTION OF PREFERRED EXAMPLE EMBODIMENTS AND OF THE BEST MODE OF THE INVENTION

Figure 1:
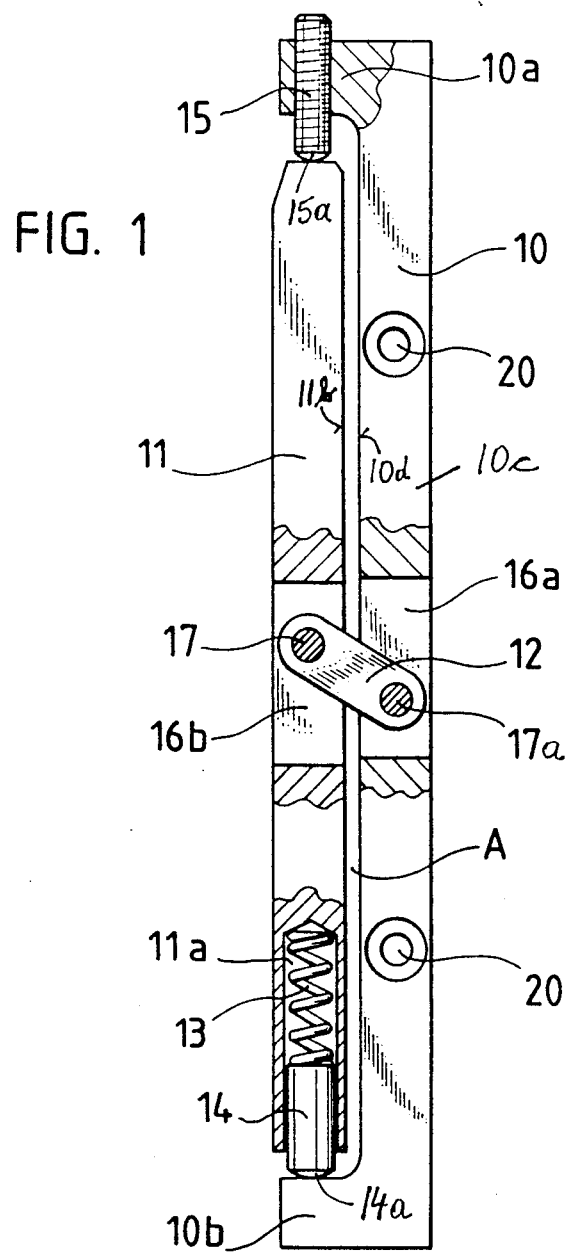
FIG. 1 illustrates a side view partially in section of a first embodiment of a clamping device according to the invention.

Referring to FIG. 1, the present clamping device comprises a mounting member 10 having a first longitudinal central section 10c and two bracing sections 10a and 10b. The bracing sections 10a and 10b may be bent-over end portions of the central section 10c. An elongated clamping member 11 which may have the same crosssectional shape as the mounting member 10, for example square or rectangular, is mounted for movement relative to the mounting member 10 to form a clamping gap A between the two facing surfaces 10d and 11b of the mounting member 10 and clamping member 11 respectively.

The clamping member 11 is movably secured to the mounting member 10 by a pivotable connecting link 12 secured to the member 11 by a journal member 17 and to the mounting member 10 by a journal member 17a. The pivoting connecting link 12 is guided in longitudinal openings or recesses 16a in the mounting member 10 and 16b in the clamping member 11.

Biasing means bearing against the bracing section 10b are operatively interposed between the lower end of the clamping member 11 and the bracing section 10b. The clamping means comprise a compression spring 13 slidably received in an axial bore 11a of the clamping member 11 and bearing against a biasing bolt 14 also slidably received in the bore 11a and having a lower rounded end 14a bearing against the upwardly facing surface of the bracing section 10b. The rounded end 14a of the biasing bolt 14 facilitates a proper sliding movement of this surface on the bracing section 10b when the gap A widens or narrows depending on the adjustment of the clamp operating means which are received for axial movement in the upper bracing section 10a. For example, the adjustment means comprise a set-screw 15 received in a threaded hole of the bracing section 10a and bearing with its rounded end 15a against an upwardly facing surface of the clamping member 11. The rounded surface again facilitates the above mentioned movement of the clamping member 11 toward and away from the mounting member 10.

The mounting member 10 is provided with mounting means 20 for securing the member 10 to a housing chassis or the like.

With the aid of the axially movable adjustment screw 15, the clamping member 11 may be moved downwardly against the force of the biasing spring 13, whereby the connecting link 12 simultaneously causes a lateral movement to the left, thereby widening the gap A. When the screw 15 is turned to move in the opposite axial direction, the spring 13 will close the gap A, thereby holding a printed circuit board in place. The printed circuit board is inserted into the gap A.

Figure 2:
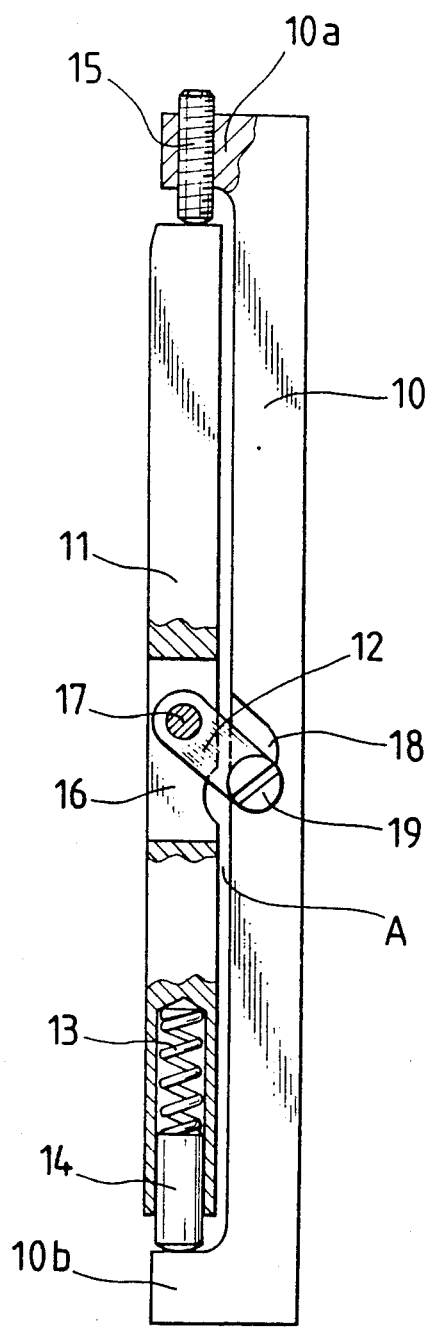
FIG. 2 is a view similar to that of FIG. 1, but showing a somewhat modified clamping device of the invention.

FIG. 2 is a clamping device according to the invention quite similar to that of FIG. 1, except that the pivoting connecting link 12 in FIG. 2 is connected to the mounting member 10 by a bolt screw 19 which permits a tilting movement of the link 12 within the limits of a recess 18 which may be machined into the mounting member 10 or in the side of the mounting member 10. The other end of the link 12 is connected to the clamping member 11 as described above with reference to FIG. 1. As in FIG. 1, the connecting link is guided in the elongated hole 16 and in the same way as it is guided in the holes 16a and 16b in FIG. 1. Additionally, the recess 18 provides upper and lower limits for the tilting movement of the link 12 in FIG. 2.

The clamping element according to the invention can be used individually, or it may be installed in a housing or the like as described above.

Although the invention has been described with reference to specific example embodiments, it will be appreciated, that it is intended to cover all modifications and equivalents within the scope of the appended claims.

What I claim is:

1. A clamping device, especially for printed circuit boards, comprising a mounting member having a section with a first clamping surface and a bracing section at each end of said first section, said bracing sections extending away from said first section to form two supports facing toward each other, a clamping member having a second clamping surface for forming with said first clamping surface a clamping gap, pivoting link means for connecting said clamping member to said mounting member so that said first and second clamping surfaces face each other, biasing spring means operatively arranged between one end of said clamping member and one of said bracing sections for biasing said first and second clamping surfaces toward each other, and adjustment means arranged between the other end of said clamping member and the other bracing section for adjusting said clamping gap for receiving a printed circuit board in said clamping gap, and wherein said mounting member and said clamping member each have a longitudinal hole, said pivoting link means comprising a link and journal members pivotally connecting said link to said mounting member and to said clamping member in said longitudinal holes, whereby said link is guided in said longitudinal holes.

2. The clamping device of claim 1, wherein said biasing spring means comprise a compression spring and a bolt biased by said compression spring against said one bracing section, and wherein said adjustment means comprise a threaded hole in said other bracing section and a set screw in said threaded hole, said set-screw bearing against said other end of said clamping member for counteracting said biasing spring means.

3. The clamping device of claim 2, wherein said clamping member has an axial bore in said one end, said compression spring and said bolt being received in said bore with a sliding fit, whereby said bolt projects from said bore to bear against said one bracing section.

4. The clamping device of claim 1, wherein said mounting member and said clamping member each have a substantially the same cross-section.

5. The clamping device of claim 1, wherein said mounting member comprises means for securing said clamping device to a support structure.

6. A clamping device, especially for printed circuit boards, comprising a mounting member having a section with a first clamping surface and a bracing section at each end of said first section, said bracing sections extending away from said first section to form two supports facing toward each other, a clamping member having a second clamping surface for forming with said first clamping gap, pivoting link means for connecting said clamping member to said mounting member so that said first and second clamping surfaces face each other, biasing spring means operatively arranged between one end of said clamping member and one of said bracing sections for biasing said first and second clamping surfaces toward each other, and adjustment means arranged between the other end of said clamping member and the other bracing section for adjusting said clamping gap for receiving a printed circuit board in said clamping gap, wherein at least one of said mounting member and said clamping member has a recess, said pivoting link means comprising a link and journal means pivotally connecting said link to said mounting member and to said clamping member, said recess having such a curved configuration that said link can pivot within a range defined by said recess.

7. The clamping device of claim 6, wherein said journal means comprise a journal bolt tiltably connecting one end of said link to said mounting member in said recess and a further journal bolt tiltably connecting the other end of said link to said clamping member

* * * * *

UNITED STATES PATENT AND TRADEMARK OFFICE
CERTIFICATE OF CORRECTION

PATENT NO. : 4,794,676

DATED : January 3, 1989

INVENTOR(S) : Hans Rose

It is certified that error appears in the above-identified patent and that said Letters Patent is hereby corrected as shown below:

```
Claim 6, column 4, line 30 (actual line count) after
              "clamping" insert --surface a clamping--.
```

Signed and Sealed this

Twenty-fifth Day of April, 1989

*Attest:*

DONALD J. QUIGG

*Attesting Officer*  *Commissioner of Patents and Trademarks*